(12) United States Patent
Chamberlin et al.

(10) Patent No.: US 11,335,835 B2
(45) Date of Patent: May 17, 2022

(54) CONVERTER FILL FOR LED ARRAY

(71) Applicant: Lumileds LLC, San Jose, CA (US)

(72) Inventors: Danielle Russell Chamberlin, Belmont, CA (US); Erik Maria Roeling, Son (NL); Sumit Gangwal, San Jose, CA (US); Niek Van Leth, Valdenswaard (NL); Oleg Borisovich Shchekin, San Francisco, CA (US)

(73) Assignee: Lumileds LLC, San Jose, CA (US)

( * ) Notice: Subject to any disclaimer, the term of this patent is extended or adjusted under 35 U.S.C. 154(b) by 310 days.

(21) Appl. No.: 16/226,608

(22) Filed: Dec. 19, 2018

(65) Prior Publication Data

US 2019/0189684 A1 Jun. 20, 2019

Related U.S. Application Data

(60) Provisional application No. 62/608,521, filed on Dec. 20, 2017.

(30) Foreign Application Priority Data

Feb. 28, 2018 (EP) ..................... 18159224

(51) Int. Cl.
*H01L 33/50* (2010.01)
*H01L 33/46* (2010.01)
(Continued)

(52) U.S. Cl.
CPC ............. *H01L 33/505* (2013.01); *G09G 3/32* (2013.01); *H01L 25/0753* (2013.01);
(Continued)

(58) Field of Classification Search
CPC ..... H01L 33/005; H01L 33/50; H01L 33/505; H01L 2933/0033; H01L 2933/0041; H01L 2933/0091; H01L 25/0753; H01L 27/156
See application file for complete search history.

(56) References Cited

U.S. PATENT DOCUMENTS

| 8,686,429 B2 | 4/2014 | Bergmann et al. |
| 8,993,358 B2 | 3/2015 | Mei et al. |

(Continued)

FOREIGN PATENT DOCUMENTS

| CN | 106025040 A | 10/2016 |
| CN | 107272317 B | 10/2019 |

(Continued)

OTHER PUBLICATIONS

International Search Report corresponding to PCT/US2018/066960, dated Mar. 26, 2019, 1 page.

(Continued)

*Primary Examiner* — Matthew C Landau
*Assistant Examiner* — Mark Hatzilambrou

(57) ABSTRACT

An optical isolation material may be applied to walls of a first cavity and a second cavity in a wafer mesh. A wavelength converting layer may be deposited into the first cavity to create a first segment and into the second cavity to create a second segment. The first segment may be attached to a first light emitting device to create a first pixel and the second segment to a second light emitting device to create a second pixel. The wafer mesh may be removed.

20 Claims, 17 Drawing Sheets

(51) Int. Cl.

| | | |
|---|---|---|
| | *H01L 27/15* | (2006.01) |
| | *H01L 25/075* | (2006.01) |
| | *H01L 33/00* | (2010.01) |
| | *H01L 33/60* | (2010.01) |
| | *H01L 33/32* | (2010.01) |
| | *H01L 33/38* | (2010.01) |
| | *G09G 3/32* | (2016.01) |
| | *H01L 33/62* | (2010.01) |

(52) U.S. Cl.
CPC .......... *H01L 27/156* (2013.01); *H01L 33/005* (2013.01); *H01L 33/32* (2013.01); *H01L 33/382* (2013.01); *H01L 33/46* (2013.01); *H01L 33/50* (2013.01); *H01L 33/60* (2013.01); *H01L 33/62* (2013.01); *H01L 2933/0016* (2013.01); *H01L 2933/0025* (2013.01); *H01L 2933/0033* (2013.01); *H01L 2933/0041* (2013.01); *H01L 2933/0091* (2013.01)

(56) References Cited

U.S. PATENT DOCUMENTS

| | | | |
|---|---|---|---|
| 9,214,609 | B2 | 12/2015 | Bechtel et al. |
| 9,624,124 | B2 | 4/2017 | Aitken et al. |
| 9,941,447 | B2 | 4/2018 | Ichikawa |
| 10,243,122 | B2 | 3/2019 | Ito |
| 2011/0044026 | A1* | 2/2011 | Deeben ................. H01L 33/508 362/84 |
| 2011/0266569 | A1 | 11/2011 | Basin et al. |
| 2013/0210179 | A1 | 8/2013 | Mei et al. |
| 2015/0171372 | A1 | 6/2015 | Iwata et al. |
| 2015/0311405 | A1 | 10/2015 | Oyamada et al. |
| 2016/0268488 | A1 | 9/2016 | Goeoetz et al. |
| 2017/0133562 | A1 | 5/2017 | Ling et al. |
| 2020/0025351 | A1 | 1/2020 | Kwon et al. |

FOREIGN PATENT DOCUMENTS

| | | |
|---|---|---|
| DE | 102016106841 B3 | 3/2017 |
| EP | 2610058 | 7/2013 |
| EP | 3012878 | 4/2016 |
| EP | 3012878 A1 | 4/2016 |
| JP | 2014-504030 A | 2/2014 |
| JP | 2015-181140 A | 10/2015 |
| JP | 2015-225862 A | 12/2015 |
| JP | 2016-536791 A | 11/2016 |
| JP | 2017-076719 A | 4/2017 |
| KR | 2014-0044877 A | 4/2014 |
| TW | 201021087 A | 6/2010 |
| TW | 201143165 A | 12/2011 |
| TW | 201334233 A | 8/2013 |
| TW | 201614875 A | 4/2016 |
| WO | 2013/175338 | 11/2013 |
| WO | 2014/006987 A1 | 1/2014 |

OTHER PUBLICATIONS

International Search Report and Written Opinion from the EPO as ISA, corresponding to PCT/US2018/066960, dated Mar. 26, 2019, 21 pages.

The partial European Search Report, corresponding to EP 18159224.7, dated Aug. 9, 2018, 13 pages.

English language bibliographic abstract of CN107272317A, published Oct. 20, 2017, Applicant: Appotronics Co Ltd, (corresponding to CN107272317B) 1 page.

* cited by examiner

CONVERTER FILL FOR LED ARRAY

BACKGROUND

Precision control lighting applications can require the production and manufacturing of small addressable light emitting diode (LED) pixel systems. Manufacturing such LED pixel systems can require accurate deposition of material due to the small size of the pixels and the small lane space between the systems. Semiconductor light-emitting devices including LEDs, resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, composite, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

III-nitride devices are often formed as inverted or flip chip devices, where both the n- and p-contacts formed on the same side of the semiconductor structure, and most of the light is extracted from the side of the semiconductor structure opposite the contacts.

SUMMARY

An optical isolation material may be applied to walls of a first cavity and a second cavity in a wafer mesh. A wavelength converting layer may be deposited into the first cavity to create a first segment and into the second cavity to create a second segment. The first segment may be attached to a first light emitting device to create a first pixel and the second segment to a second light emitting device to create a second pixel. The wafer mesh may be removed.

BRIEF DESCRIPTION OF THE DRAWINGS

A more detailed understanding may be had from the following description, given by way of example in conjunction with the accompanying drawings wherein.

DETAILED DESCRIPTION

Figure 1A:
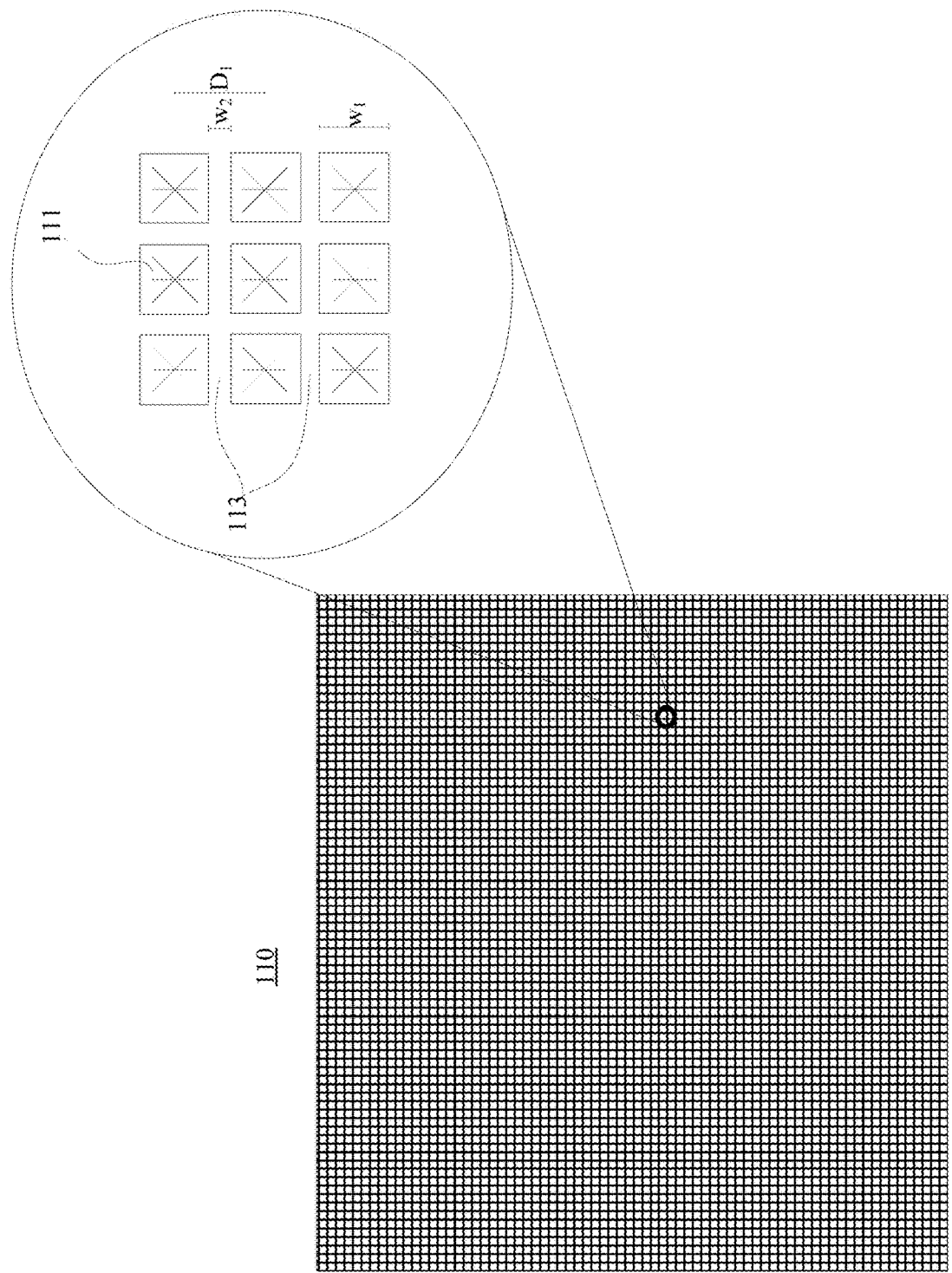
FIG. 1A is a top view illustration of a micro LED array with an exploded portion.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices (LEDs) or optical power emitting devices, such as devices that emit ultraviolet (UV) or infrared (IR) optical power, are among the most efficient light sources currently available. These devices (hereinafter "LEDs"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

Figure 1B:
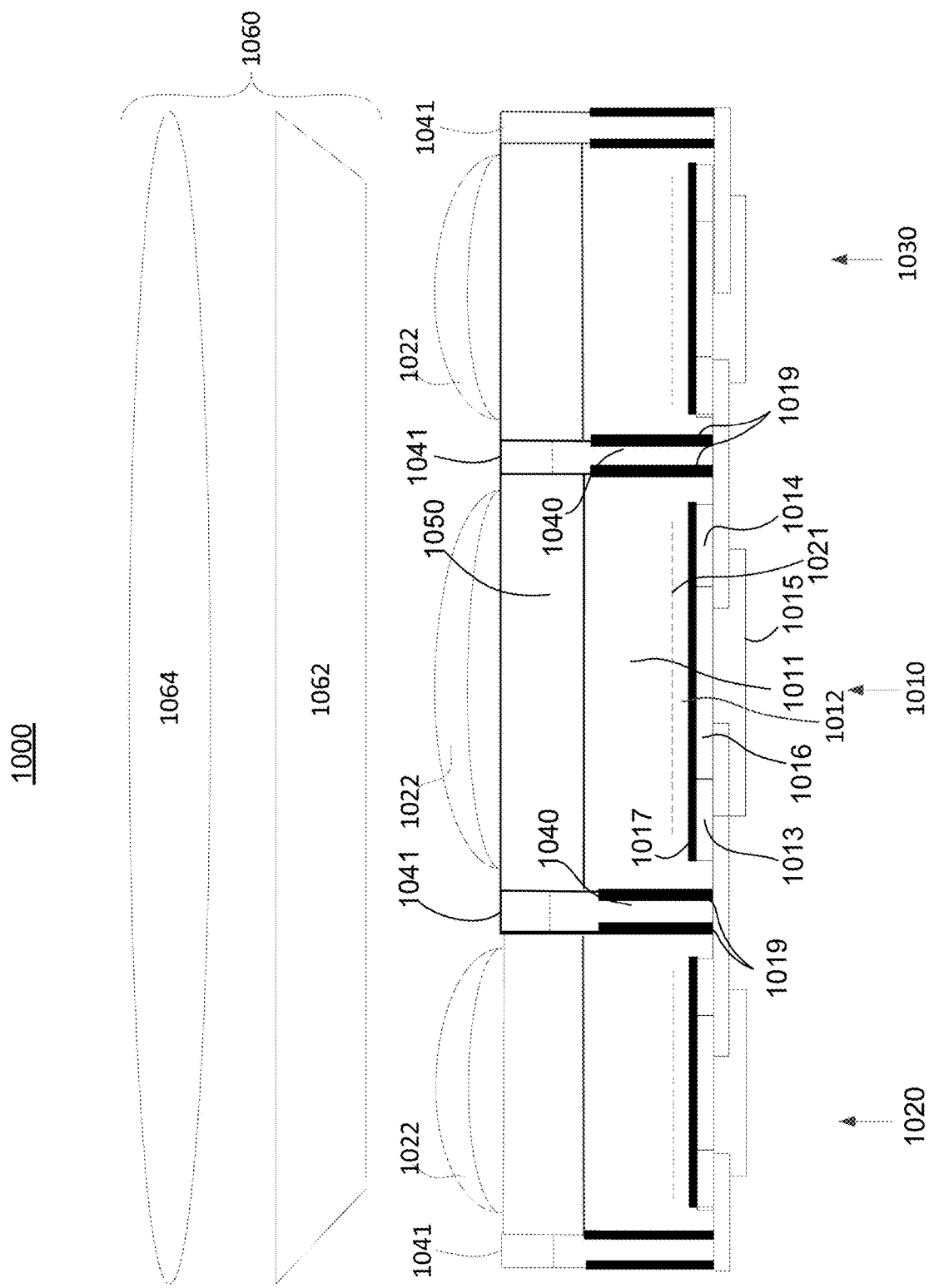
FIG. 1B is a cross sectional illustration of a pixel matrix with trenches.
Figure 1C:
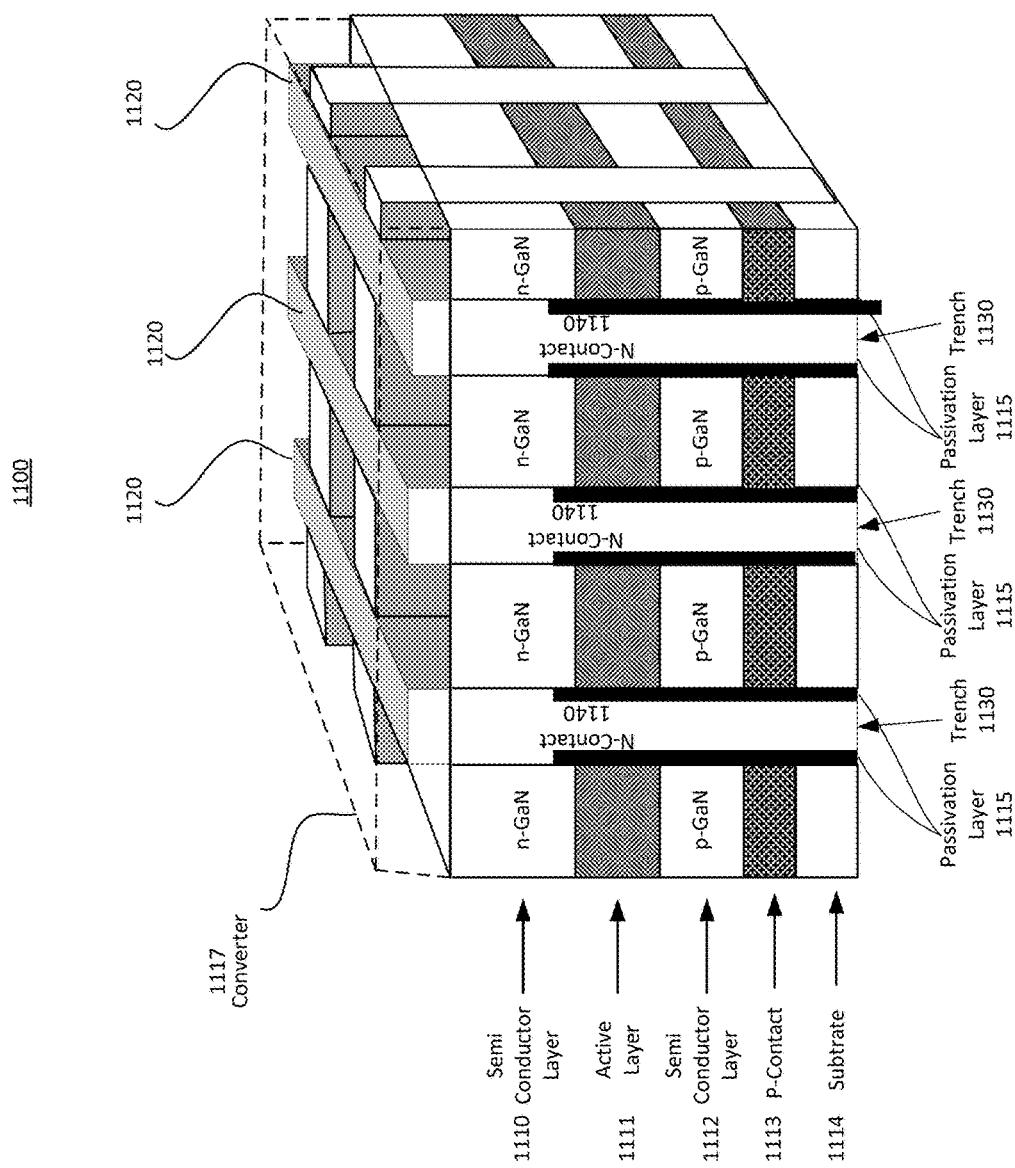
FIG. 1C is a perspective illustration of another pixel matrix with trenches.

According to embodiments of the disclosed subject matter, LED arrays (e.g., micro LED arrays) may include an array of pixels as shown in FIGS. 1A, 1B, and/or 1C. LED arrays may be used for any applications such as those requiring precision control of LED array segments. Pixels in an LED array may be individually addressable, may be addressable in groups/subsets, or may not be addressable. In FIG. 1A, a top view of a LED array 110 with pixels 111 is shown. An exploded view of a 3×3 portion of the LED array 110 is also shown in FIG. 1A. As shown in the 3×3 portion exploded view, LED array 110 may include pixels 111 with a width $w_1$ of approximately 100 μm or less (e.g., 40 μm). The lanes 113 between the pixels may be separated by a width, $w_2$, of approximately 20 μm or less (e.g., 5 μm). The lanes 113 may provide an air gap between pixels or may contain other material, as shown in FIGS. 1B and 1C and further disclosed herein. The distance $d_1$ from the center of one pixel 111 to the center of an adjacent pixel 111 may be approximately 120 μm or less (e.g., 45 μm). It will be understood that the widths and distances provided herein are examples only, and that actual widths and/or dimensions may vary.

It will be understood that although rectangular pixels arranged in a symmetric matrix are shown in FIGS. 1A, B and C, pixels of any shape and arrangement may be applied to the embodiments disclosed herein. For example, LED array 110 of FIG. 1A may include, over 10,000 pixels in any applicable arrangement such as a 100×100 matrix, a 200×50 matrix, a symmetric matrix, a non-symmetric matrix, or the like. It will also be understood that multiple sets of pixels, matrixes, and/or boards may be arranged in any applicable format to implement the embodiments disclosed herein.

FIG. 1B shows a cross section view of an example LED array 1000. As shown, the pixels 1010, 1020, and 1030 correspond to three different pixels within an LED array such that a separation sections 1041 and/or n-type contacts 1040 separate the pixels from each other. According to an embodiment, the space between pixels may be occupied by an air gap. As shown, pixel 1010 includes an epitaxial layer 1011 which may be grown on any applicable substrate such as, for example, a sapphire substrate, which may be removed from the epitaxial layer 1011. A surface of the growth layer distal from contact 1015 may be substantially planar or may be patterned. A p-type region 1012 may be located in proximity to a p-contact 1017. An active region 1021 may be disposed adjacent to the n-type region and a p-type region 1012. Alternatively, the active region 1021 may be between a semiconductor layer or n-type region and p-type region 1012 and may receive a current such that the active region 1021 emits light beams. The p-contact 1017 may be in contact with $SiO_2$ layers 1013 and 1014 as well as plated metal layer 1016 (e.g., plated copper). The n type contacts 1040 may include an applicable metal such as Cu. The metal layer 1016 may be in contact with a contact 1015 which may reflective.

Notably, as shown in FIG. 1B, the n-type contact 1040 may be deposited into trenches 1130 created between pixels 1010, 1020, and 1030 and may extend beyond the epitaxial layer. Separation sections 1041 may separate all (as shown) or part of a wavelength converting layer 1050. It will be understood that a LED array may be implemented without such separation sections 1041 or the separation sections 1041 may correspond to an air gap. The separation sections 1041 may be an extension of the n-type contacts 1040, such that, separation sections 1041 are formed from the same material as the n-type contacts 1040 (e.g., copper). Alternatively, the separation sections 1041 may be formed from a material different than the n-type contacts 1040. According to an embodiment, separation sections 1041 may include reflective material. The material in separation sections 1041 and/or the n-type contact 1040 may be deposited in any applicable manner such as, for example, but applying a mesh structure which includes or allows the deposition of the n-type contact 1040 and/or separation sections 1041. Wavelength converting layer 1050 may have features/properties similar to wavelength converting layer 205 of FIG. 2A. As noted herein, one or more additional layers may coat the separation sections 1041. Such a layer may be a first optical material which may be a reflective layer, a scattering layer, an absorptive layer, or any other applicable layer. One or more passivation layers 1019 may fully or partially separate the n-contact 1040 from the epitaxial layer 1011.

The epitaxial layer 1011 may be formed from any applicable material to emit photons when excited including sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example semiconductors may have indices of refraction ranging from about 2.4 to about 4.1 at the typical emission wavelengths of LEDs in which they are present. For example, III-Nitride semiconductors, such as GaN, may have refractive indices of about 2.4 at 500 nm, and III-Phosphide semiconductors, such as InGaP, may have refractive indices of about 3.7 at 600 nm. Contacts coupled to the LED device 200 may be formed from a solder, such as AuSn, AuGa, AuSi or SAC solders.

The n-type region may be grown on a growth substrate and may include one or more layers of semiconductor material that include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Similarly, the p-type region 1012 may include multiple layers of different composition, thickness, and dopant concentrations, including layers that are not intentionally doped, or n-type layers. An electrical current may be caused to flow through the p-n junction (e.g., via contacts) and the pixels may generate light of a first wavelength determined at least in part by the bandgap energy of the materials. A pixel may directly emit light (e.g., regular or direct emission LED) or may emit light into a wavelength converting layer 1050 (e.g., phosphor converted LED, "PCLED", etc.) that acts to further modify wavelength of the emitted light to output a light of a second wavelength.

Although FIG. 1B shows an example LED array 1000 with pixels 1010, 1020, and 1030 in an example arrangement, it will be understood that pixels in an LED array may be provided in any one of a number of arrangements. For example, the pixels may be in a flip chip structure, a vertical injection thin film (VTF) structure, a multi-junction structure, a thin film flip chip (TFFC), lateral devices, etc. For example, a lateral LED pixel may be similar to a flip chip LED pixel but may not be flipped upside down for direct connection of the electrodes to a substrate or package. A TFFC may also be similar to a flip chip LED pixel but may have the growth substrate removed (leaving the thin film semiconductor layers un-supported). In contrast, the growth substrate or other substrate may be included as part of a flip chip LED.

The wavelength converting layer 1050 may be in the path of light emitted by active region 1021, such that the light emitted by active region 1021 may traverse through one or more intermediate layers (e.g., a photonic layer). According to embodiments, wavelength converting layer 1050 or may not be present in LED array 1000. The wavelength converting layer 1050 may include any luminescent material, such as, for example, phosphor particles in a transparent or translucent binder or matrix, or a ceramic phosphor element, which absorbs light of one wavelength and emits light of a different wavelength. The thickness of a wavelength converting layer 1050 may be determined based on the material used or application/wavelength for which the LED array 1000 or individual pixels 1010, 1020, and 1030 is/are arranged. For example, a wavelength converting layer 1050 may be approximately 20 μm, 50 μm or 200 μm. The wavelength converting layer 1050 may be provided on each individual pixel, as shown, or may be placed over an entire LED array 1000.

Primary optic 1022 may be on or over one or more pixels 1010, 1020, and/or 1030 and may allow light to pass from the active region 101 and/or the wavelength converting layer 1050 through the primary optic. Light via the primary optic may generally be emitted based on a Lambertian distribution pattern such that the luminous intensity of the light emitted via the primary optic 1022, when observed from an ideal diffuse radiator, is directly proportional to the cosine of the angle between the direction of the incident light and the surface normal. It will be understood that one or more properties of the primary optic 1022 may be modified to produce a light distribution pattern that is different than the Lambertian distribution pattern.

Secondary optics which include one or both of the lens 1065 and waveguide 1062 may be provided with pixels 1010, 1020, and/or 1030. It will be understood that although secondary optics are discussed in accordance with the example shown in FIG. 1B with multiple pixels, secondary optics may be provided for single pixels. Secondary optics may be used to spread the incoming light (diverging optics), or to gather incoming light into a collimated beam (collimating optics). The waveguide 1062 may be coated with a dielectric material, a metallization layer, or the like and may be provided to reflect or redirect incident light. In alternative embodiments, a lighting system may not include one or more of the following: the wavelength converting layer 1050, the primary optics 1022, the waveguide 1062 and the lens 1065.

Lens 1065 may be formed form any applicable transparent material such as, but not limited to SiC, aluminum oxide, diamond, or the like or a combination thereof. Lens 1065 may be used to modify the a beam of light to be input into the lens 1065 such that an output beam from the lens 1065 will efficiently meet a desired photometric specification. Additionally, lens 1065 may serve one or more aesthetic purpose, such as by determining a lit and/or unlit appearance of the multiple LED devices 200B.

FIG. 1C shows a cross section of a three dimensional view of a LED array 1100. As shown, pixels in the LED array 1100 may be separated by trenches which are filled to form n-contacts 1140. The pixels may be grown on a substrate 1114 and may include a p-contact 1113, a p-GaN semiconductor layer 1112, an active region 1111, and an n-Gan semiconductor layer 1110. It will be understood that this structure is provided as an example only and one or more semiconductor or other applicable layers may be added, removed, or partially added or removed to implement the disclosure provided herein. A wavelength converting layer 1117 may be deposited on the semiconductor layer 1110 (or other applicable layer).

Passivation layers 1115 may be formed within the trenches 1130 and n-contacts 1140 (e.g., copper contacts) may be deposited within the trenches 1130, as shown. The passivation layers 1115 may separate at least a portion of the n-contacts 1140 from one or more layers of the semiconductor. According to an implementation, the n-contacts 1140, or other applicable material, within the trenches may extend into the wavelength converting layer 1117 such that the n-contacts 1140, or other applicable material, provide complete or partial optical isolation between the pixels.

Techniques disclosed herein include dicing and/or wafer level segmentation which may include generating or providing a grown or otherwise LED component such as, but not limited to, a semiconductor layer, n-type material, p-type material, wavelength converting layer, die, carrier material, or the like or a combination thereof. The component may be cured or may be treated with a temperature based treatment, chemical treatment, or other treatment. The component may be diced such that two or more segments of the component result from the dicing process. The segments may be completely isolated or may be partially isolated from each other. The segments may include a substantially uniform material or may include multiple materials. The segments may undergo additional treatments/process and may be cleaned through a, for example, chemical, ultrasonic, or other applicable cleaning process.

The subject matter disclosed herein may be applied to generating arrays with sub-500 micron pixels and sub-100 micron components. Pixels in LED arrays with sidewalls covered by optical isolation materials may be generated using the techniques disclosed herein.

As used herein, dice, dicing, or diced may correspond to or refer to any applicable manner of segmenting, dividing, apportioning, slicing, compartmentalizing, or the like, or by dicing as understood in the art. A component may be diced by any applicable manner such as sawing, etching, applying a mask to dice, using one or more lasers, chemical treatment, or the like.

Figure 1D:
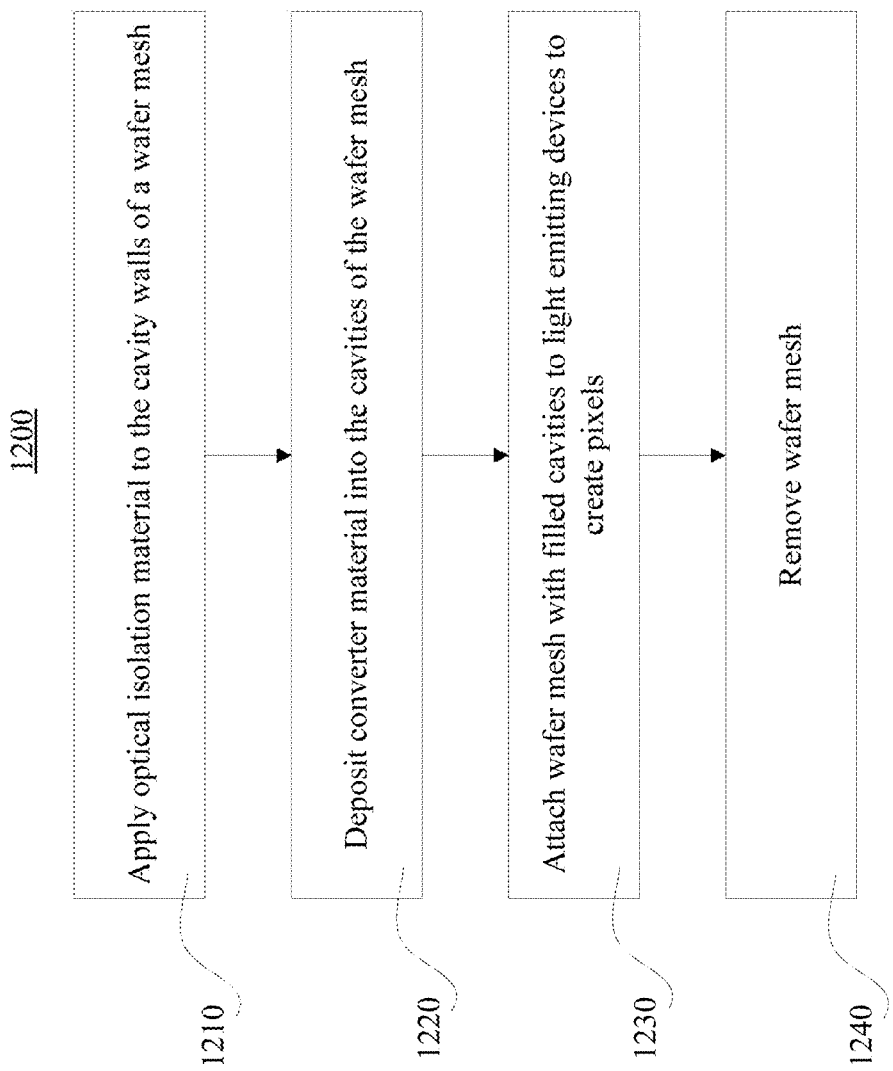
FIG. 1D is a flow diagram for generating pixels in a LED array.

FIG. 1D shows a method 1200 for generating pixels in a pixel array, according to the subject matter disclosed herein. The pixels in such an array may be sub-500 microns and may contain components in the sub-100 microns.

As shown at step 1210, optical isolation material may be applied to a wafer mesh and more specifically to the walls of the cavities contained within the mesh. At step 1220, wavelength converting layer may be deposited into the cavities of the wafer mesh and the wafer mesh with the cavities filled with wavelength converting layer may be aligned with and attached to light emitting devices to create pixels at step 1230. At step 1240, the wafer mesh may be removed.

Figure 1E:
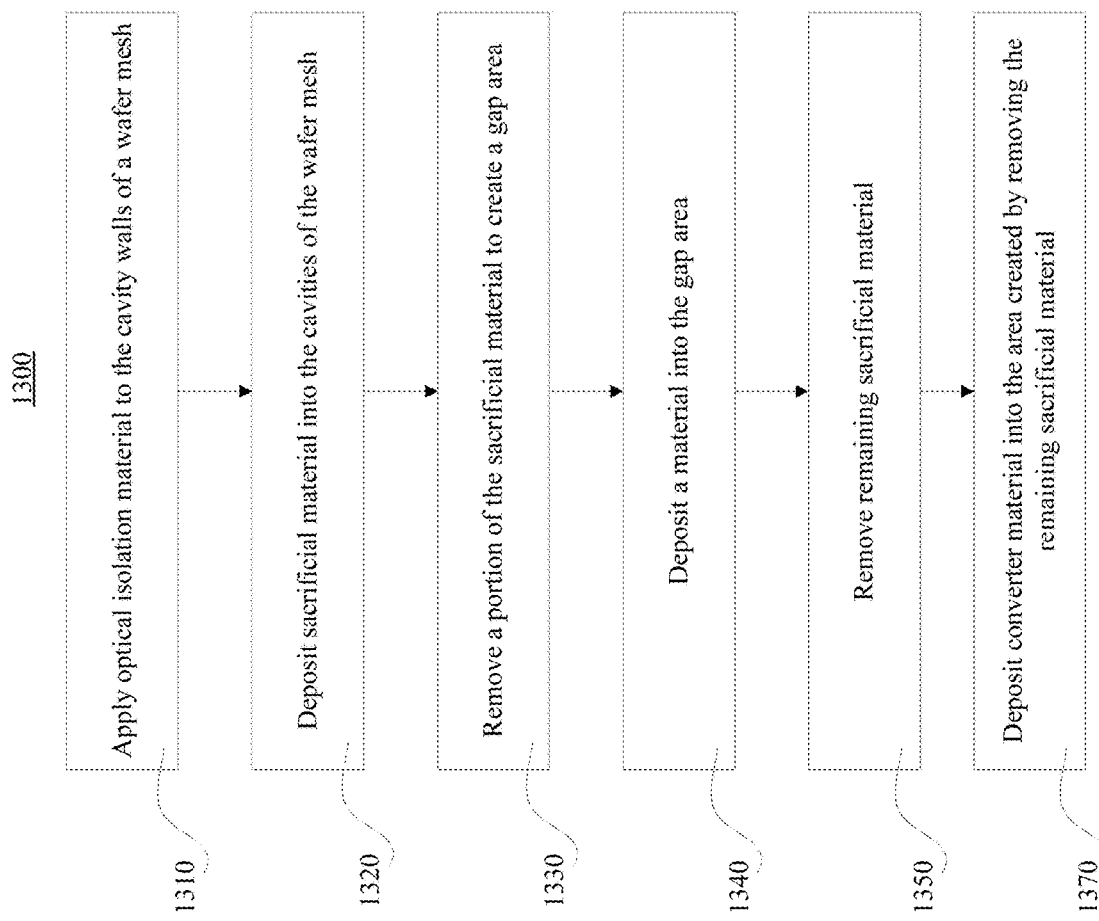
FIG. 1E is another flow diagram for generating pixels in a LED array.
Figure 1F:
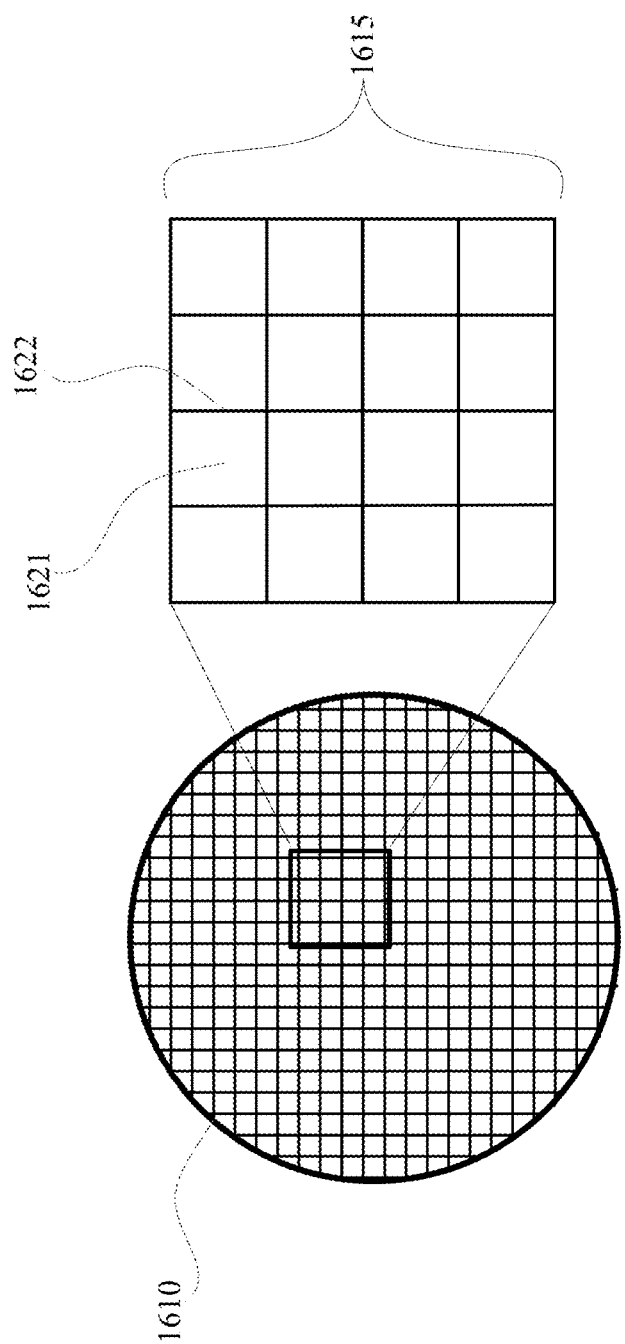
FIG. 1F is a top view diagram a mesh with cavities.
Figure 1H:
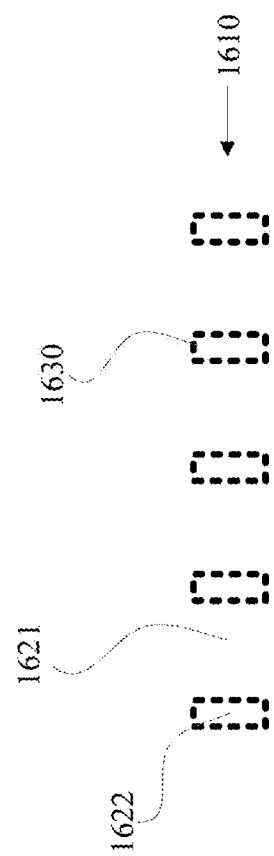
FIG. 1H is a cross-section of FIG. 1G.
Figure 1G:
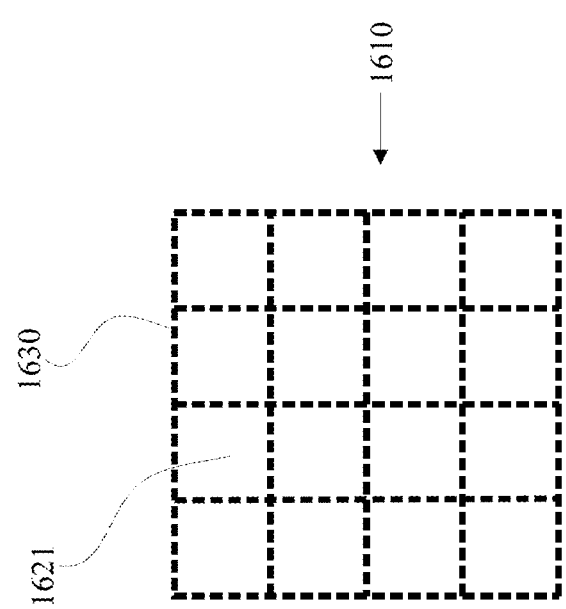
FIG. 1G is top view of a mesh with optical isolation material.

According to step 1210, as also shown in FIG. 1G, optical isolation material 1630 may be deposited onto the cavity walls 1622 of a wafer mesh 1610. The optical isolation material 1630 may be deposited using an ALD process, as described herein. At step 1220 a bi-layer of wavelength converting layer which includes the wavelength converting layer 1665 and first optical material 1655 may be deposited using any applicable technique including screen-printing, contact printing, dip coating, spray coating, lithography, or the like. To create the bi-layer of wavelength converting layer, a phosphor film and a first optical material may be pre-coated into layers on release film, for example siliconized polyester (PET) or ethylene tetrafluoroethylene (ETFE). Such a coating may be disposed via any applicable technique including, for example, slot die coating, blade coating, spray coating, and the like. A silicone binder may be solid at room temperature, flow at slightly higher temperature such as around 80-140° C., and cure at temperatures around 150° C. The layers may then be laminated together to create the bi-layer of wavelength converting layer. The bi-layer of wavelength converting layer may be attached on a tape and placed into an array pattern at room temperature or below via any applicable technique such as sawing, etching, laser cutting, stamping, or the like.

The mesh wafer 1610 may then be laminated into the gaps in the sawn bi-layer wavelength converting layer. The mesh and bi-layer wavelength converting layer may annealed in a vacuum oven such that the bilayer mesas may flow and fill the cavities 1621 of the wafer mesh 1610. At step 1230 of FIG. 1D, as also shown in FIG. 1O, the wafer mesh 1610 may be aligned with light emitting devices 1670 such that the cavities 1621 align with and attach to the light emitting devices 1670. Light emitting device 1670 may contain an active light-emitting layer and may also contain n-contacts 1671 and p-contacts 1672 that enable current to activate the active light-emitting layer. The width of the cavity walls 1622 may correspond to the required spacing between the light emitting devices 1670 such that the cavities 1621 can be aligned with and attached to the light emitting devices 1670. The resulting structure may be cured at temperatures in the range of 150° C.-180° C.

The mesh wafer 1610 may be removed using any applicable technique including etching, scraping, dicing, sawing, via one or more lasers, chemical treatment or the like. The channels created between the resulting pixels may be filled with optical isolation material.

FIG. 1E shows a method 1300 for generating pixels in a pixel array, according to the subject matter disclosed herein. The pixels in such an array may be sub-500 microns and may contain components in the sub-100 microns.

As shown at step 1310, optical isolation material may be applied to a wafer mesh and more specifically to the walls of the cavities contained within the mesh. At step 1320, sacrificial material may be deposited into the cavities of the wafer mesh. At step 1330, a portion of the sacrificial material may be removed to create a gap area. At step 1340, a first optical material layer may be deposited into the gap area. At step 1350, the remaining sacrificial material may be removed and at step 1370, wavelength converting layer may be deposited into the area created by removing the remaining sacrificial material. The wafer mesh with the cavities filled with the first optical material layer and the wavelength converting layer may be aligned with and attached to light emitting devices to create pixels. The wafer mesh may be removed.

As shown in top view diagram of FIG. 1F, a wafer mesh 1610 may contain a plurality of cavities 1621. FIG. 1F also shows an enlarged portion 1615 of the cavities 1621 with cavity walls 1622. According to step 1310 of FIG. 1E, as also shown in FIG. 1G, an optical isolation material 1630 may be applied to the cavity walls 1622 (not shown in FIG. 1G) of the cavities 1621. The optical isolation material may be applied to the cavity walls 1622 (not shown in FIG. 1G) via an ALD process. As disclosed herein, ALD is a technique whereby a material may be deposited onto a surface in a self-limiting manner such that a thin coating or layer of the material is deposited into the surface. As shown in FIG. 1G, optical isolation material 1630 may be deposited onto the exposed surfaces of the wafer mesh 1610 such that the cavity walls 1622 are coated with the optical isolation material 1630. FIG. 1H shows a cross-sectional view of the wafer mesh of FIG. 1G. As shown, optical isolation material 1630 is deposited onto the cavity walls 1622 of cavities 1621.

Figures 1I, 1J:
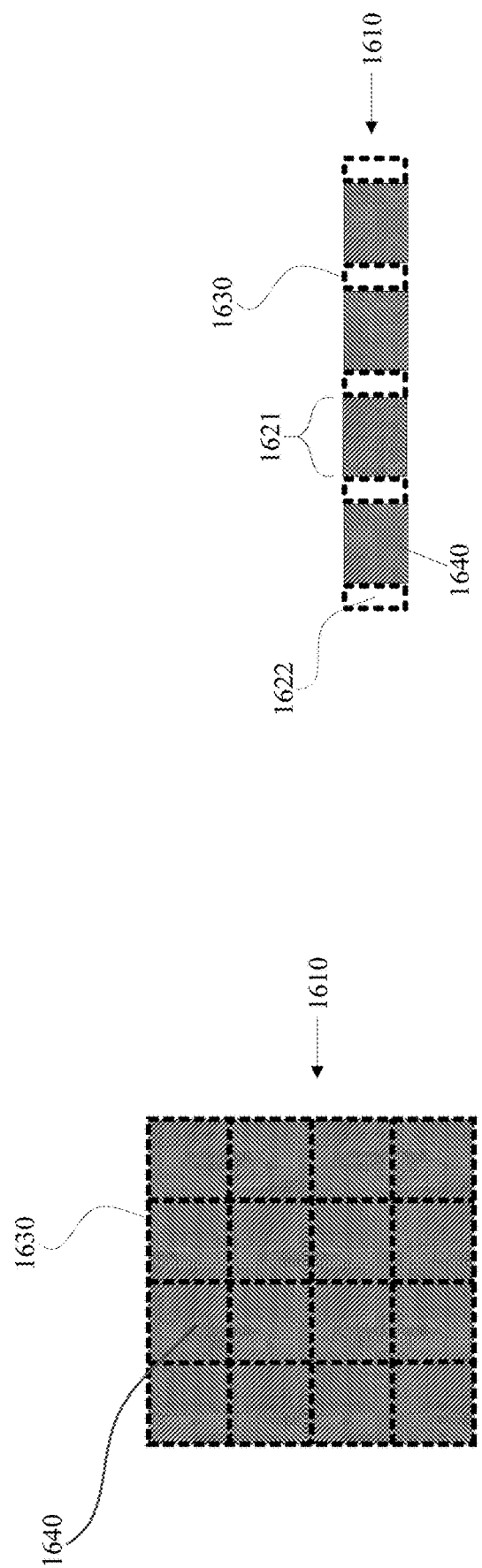
FIG. 1I is a top view of the mesh of FIG. 1G with sacrificial material.
FIG. 1J is a cross-section if FIG. 1I.
Figure 1L:
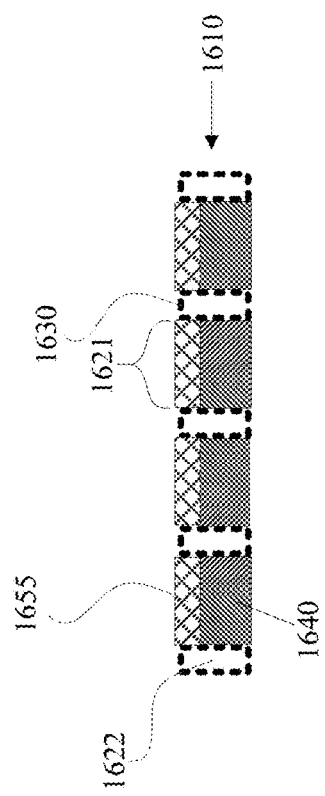
FIG. 1L is another cross section view of the mesh of FIG. 1G with partial sacrificial material removed and a first optical material added.

According to step 1320 of FIG. 1E, as also shown in FIG. 1I, a sacrificial material layer 1640 is deposited within the cavities 1621 (not shown in FIG. 1I) of the wafer mesh 1610. Sacrificial material may be any material that is configured to be removed from the cavities 1621 such that, for example, it may be etched or scraped out of the cavities 1621. The sacrificial material may be deposited via any applicable technique including screen-printing, contact printing, dip coating, spray coating, lithography, or the like. FIG. 1J shows a cross-sectional view of the wafer mesh 1610 of FIG. 1I. As shown, sacrificial material 1640 is deposited into cavities 1621 of the wafer mesh 1610.

Figure 1K:
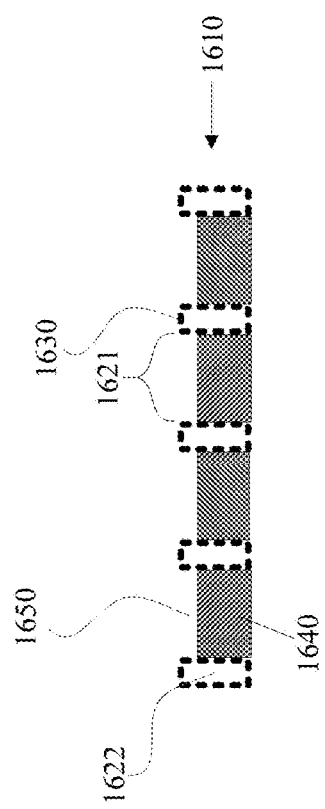
FIG. 1K is a cross section view of the mesh of FIG. 1G with partial sacrificial material removed.
Figure 1N:
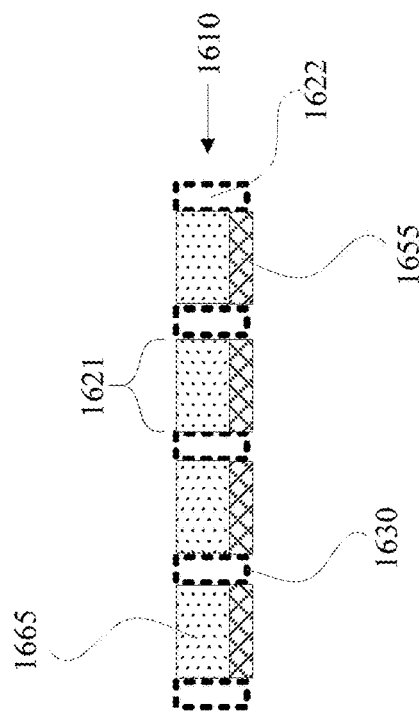
FIG. 1N is a cross-section view of the mesh of FIG. 1M with wavelength converting layers.

According to step 1330 of FIG. 1E, as also shown in FIG. 1K, a portion of the sacrificial material layer 1640 may be removed from the cavities 1621 of the wafer mesh 1610. A gap area 1650 may refer to the space that was occupied by the removed sacrificial material. The portion of the sacrificial material may be removed via any applicable technique including etching, scraping, dicing, sawing, via one or more lasers, chemical treatment, or the like. As shown in FIG. 1K, the removal of the sacrificial material shall be conducted such that the optical isolation material 1630 disposed on the cavity walls 1622 adjacent to the location of the removed sacrificial material remain after the removal of the sacrificial material.

According to step 1340 of FIG. 1E, as also shown in FIG. 1L, a first optical material 1655 may be deposited into the cavities 1621 and may fill the gap area 1650. The first optical material 1655 may only fill the gap area or may fill an area larger than the gap area by extending beyond the plane created by the removed sacrificial material.

Figure 1M:
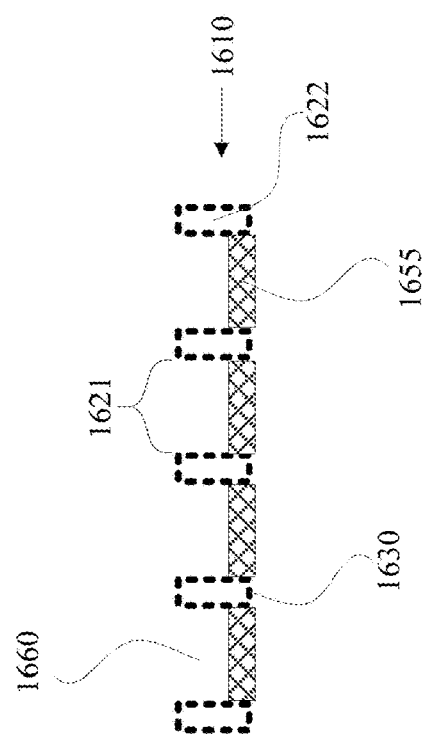
FIG. 1M is a cross section view of the mesh of FIG. 1L with all sacrificial material removed.

According to step 1350 of FIG. 1E, as also shown in FIG. 1M, the remaining sacrificial material 1640 may be removed from the cavities 1621 of the wafer mesh 1610. The remaining sacrificial material may be removed via any applicable technique including etching, scraping, dicing, sawing, via one or more lasers, chemical treatment or the like. It will be understood that the wafer mesh of FIG. 1M is a flipped when compared to the wafer mesh of FIGS. 1F-g. A gap area 1660 may refer to the space that was occupied by the removed remaining sacrificial material. As shown in FIG. 1M, the removal of the sacrificial material shall be conducted such that the optical isolation material 1630 disposed on the cavity walls 1622 adjacent to the location of the removed remaining sacrificial material remain after the removal of the remaining sacrificial material.

According to step 1370 of FIG. 1E, as also shown in FIG. 1N, a wavelength converting layer 1665 may be deposited into the cavities 1621 and may fill the gap area 1660. The wavelength converting layer 1665 may be deposited via any applicable technique including screen-printing, contact printing, dip coating, spray coating, lithography, or the like. The wavelength converting layer 1665, optical isolation material 1630, and first optical material 1655 may be cured via any applicable technique such as temperature based curing, polymer based curing, UV based curing, or the like.

Figure 1P:
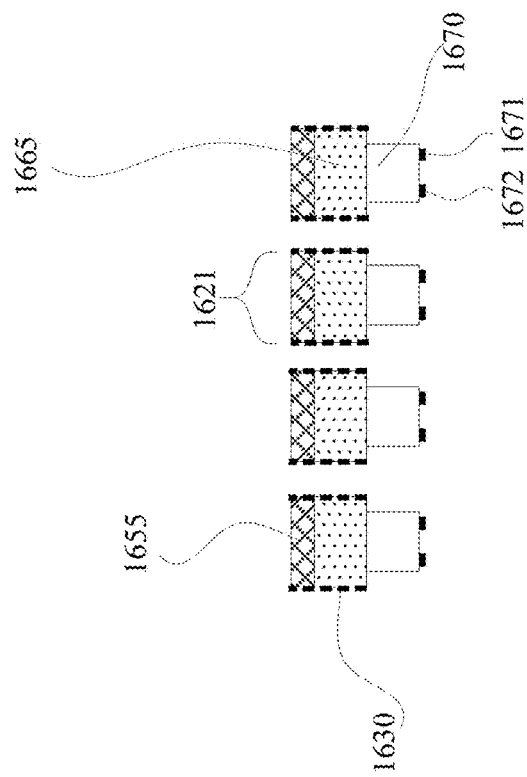
FIG. 1P is a cross section view of pixels without a mesh.
Figure 1O:
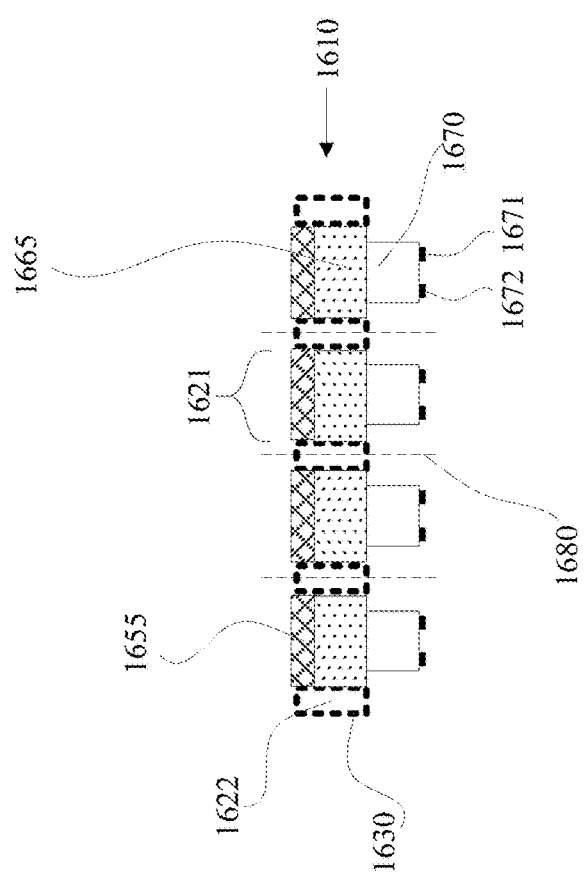
FIG. 1O is a cross section view of pixels with the a mesh.

As shown in FIG. 1O, the wafer mesh 1610 may be aligned with light emitting devices 1670 such that the cavities 1621 align with and attach to the light emitting devices 1670. The width of the cavity walls 1622 may correspond to the required spacing between the cavities 1621 such that the cavities 1621 can be aligned with and attached to the light emitting devices 1670. Light emitting device 1670 may contain an active light-emitting layer and may also contain n-contacts 1671 and p-contacts 1672 that enable current to activate the active light-emitting layer. The mesh wafer 1610 may be removed by segmenting the pixels at 1680. The mesh wafer 1610 may be removed using any applicable technique including etching, scraping, dicing, sawing, via one or more lasers, chemical treatment or the like. FIG. 1P shows the resulting pixels after removing the mesh wafer 1610 by segmenting the pixels at 1680. The channels created between the resulting pixels may be filled with optical isolation material.

Figure 1Q:
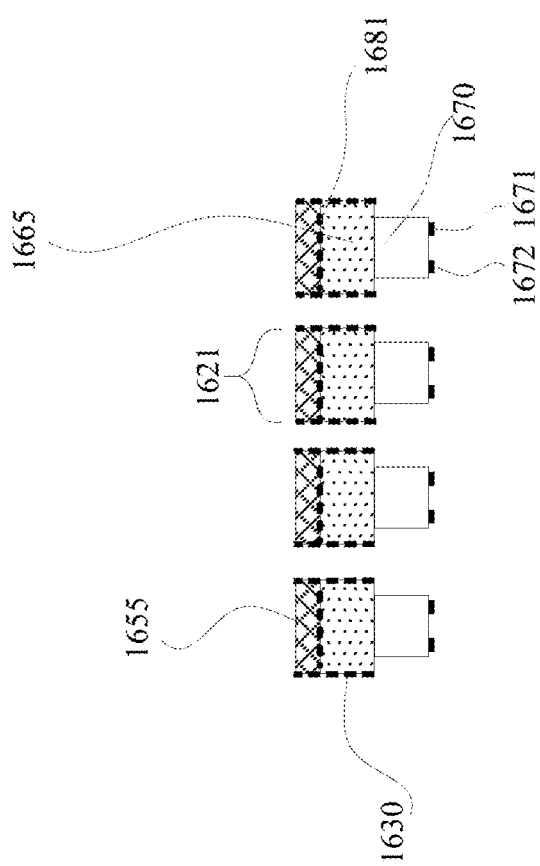
FIG. 1Q is a cross section view of pixels with trace sacrificial material.

FIG. 1Q shows the pixels of FIG. 1P with trace sacrificial material 1681 remaining between the first optical material 1655 and the wavelength converting material 1665. The trace sacrificial material 1681 may remain after the removal of the sacrificial material 1640 at FIG. 1L such that after the removal of the sacrificial material 1640, trace amounts of the trace sacrificial material 1681 may remain in a pixel. The trace sacrificial material 1681 may not have an effect on the optical properties of a given pixel or may have minimal effect on the optical properties of the given pixel. The trace sacrificial material 1681 may be detectable upon examination of a pixel with the trace sacrificial material 1681.

Figure 1R:
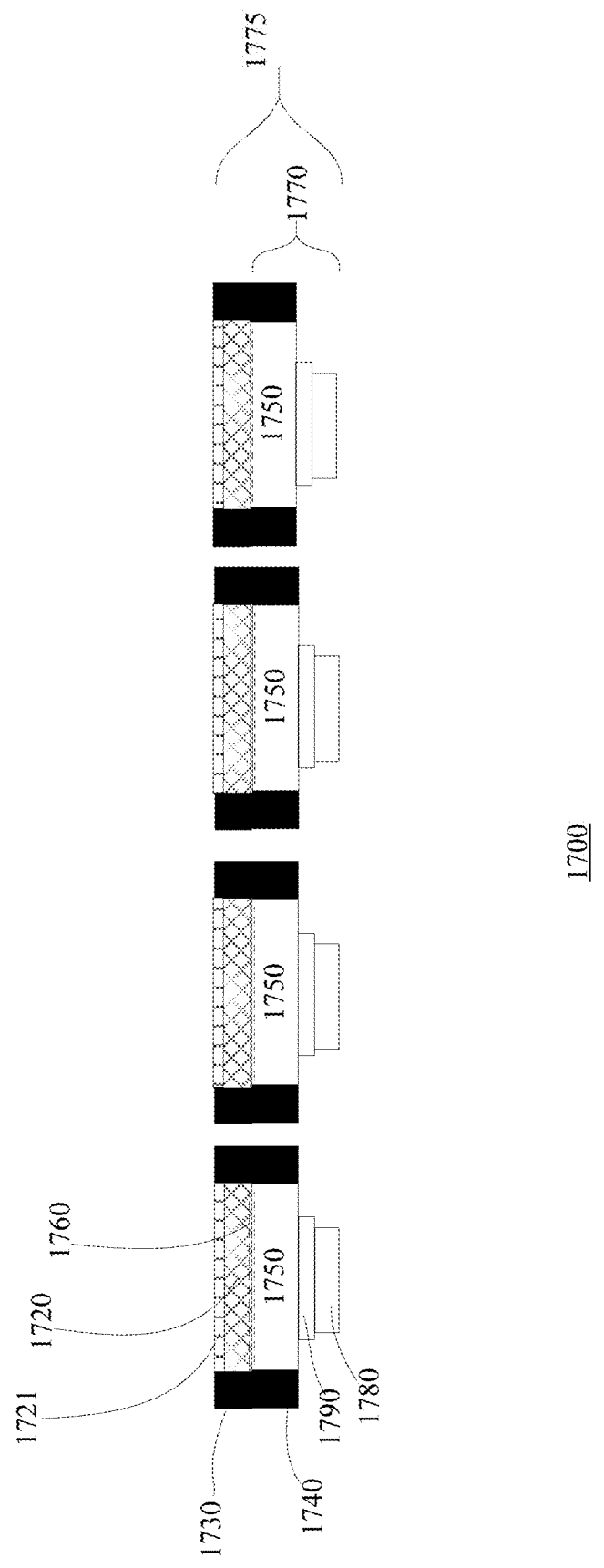
FIG. 1R is a cross section view of pixels.

As shown in FIG. 1R, wavelength converting layers 1720 may be attached to light emitting devices 1770 of an LED array 1700, to create pixels 1775. Light emitting devices 1770 may be the same as or similar to the light emitting devices 1670 of FIG. 1O. In FIG. 1R, light emitting devices 1770 may include GaN layer 1750, active region 1790, contact 1780, pattern sapphire substrate (PSS) 1760, and wavelength converting layers 1720. As shown in FIG. 1R, sidewall materials 1730 may be applied to the wavelength converting layers 1720. The wavelength converting layers 1720 may be mounted over GaN layers 1750 and pattern sapphire substrate (PSS) patterns 1760 may be located between the GaN layers 1750 and the wavelength converting layers. Active regions 1790 may be configured to emit light at least partially towards the wavelength converting layers 1720 and the light emitting devices 1770 may include contacts 1780. Optical isolator material 1740 may be applied to the sidewalls of the GaN layer 1750.

As an example, the pixels 1775 of FIG. 1R may correspond to the pixels 111 of FIG. 1A-C. Specifically, as shown in FIG. 1A, the pixels 111 may correspond to the pixels 1775 of FIG. 1R after the wavelength converting layers 1720 are mounted onto the light emitting devices 1770. When the pixels 111 or 1775 are activated, the respective active regions 1790 of the emitters may generate a light. The light may pass through the wavelength converting layers 1720 and may substantially be emitted from the surface of the pixels 1775 and light that reaches the sidewalls of the wavelength converting layers 1720 may not escape from the sidewalls due to the sidewall materials 1730 and may be reflected when it intersects the sidewalls due to the sidewall materials 1730. As shown, a the pixels 1775 may include first optical material 1721 over the wavelength converting material 1720, in accordance with the subject matter disclosed herein.

Figure 2A:
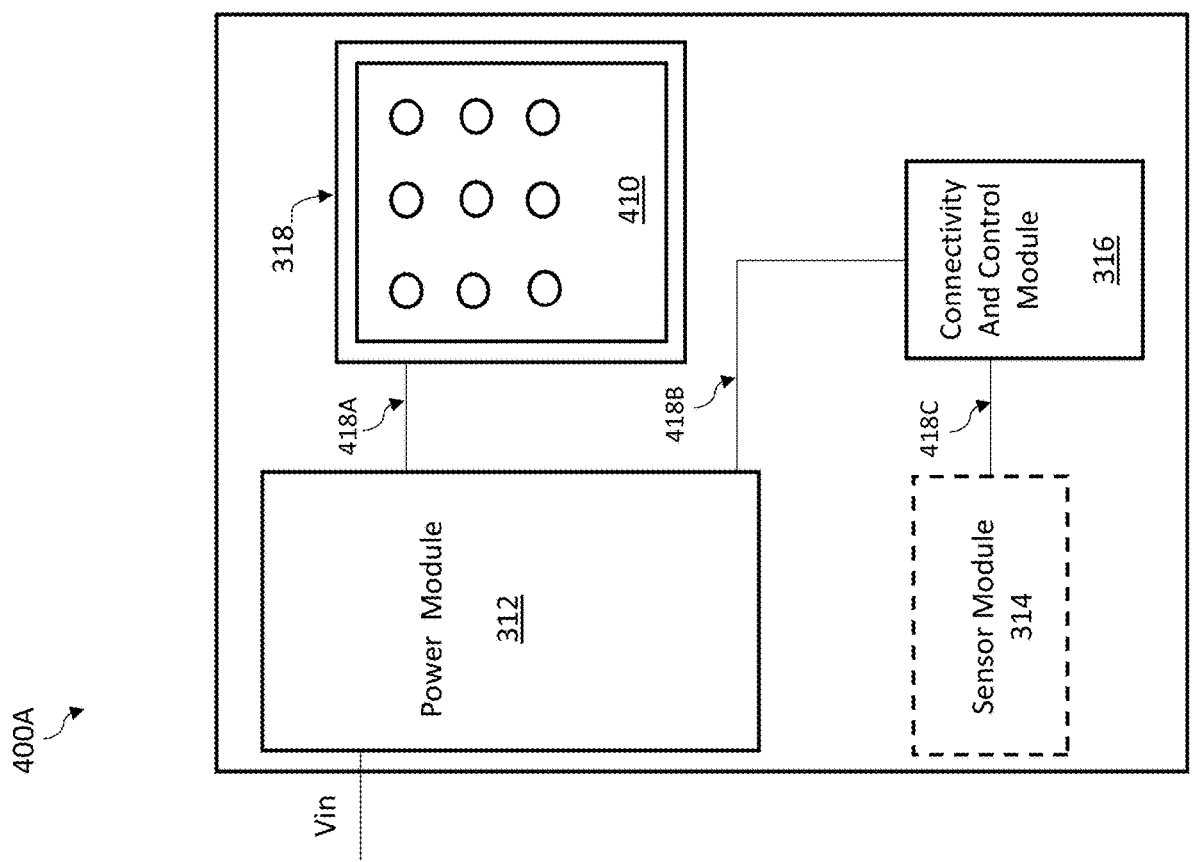
FIG. 2A is a top view of the electronics board with LED array attached to the substrate at the LED device attach region in one embodiment.

FIG. 2A is a top view of an electronics board with an LED array 410 attached to a substrate at the LED device attach region 318 in one embodiment. The electronics board together with the LED array 410 represents an LED system 400A. Additionally, the power module 312 receives a voltage input at Vin 497 and control signals from the connectivity and control module 316 over traces 418B, and provides drive signals to the LED array 410 over traces 418A. The LED array 410 is turned on and off via the drive signals from the power module 312. In the embodiment shown in FIG. 2A, the connectivity and control module 316 receives sensor signals from the sensor module 314 over trace 418C. Pixels in the LED array 410 may be created in accordance with the steps FIG. 1D and/or FIG. 1E and as shown in FIGS. 1F-Q.

Figure 2B:
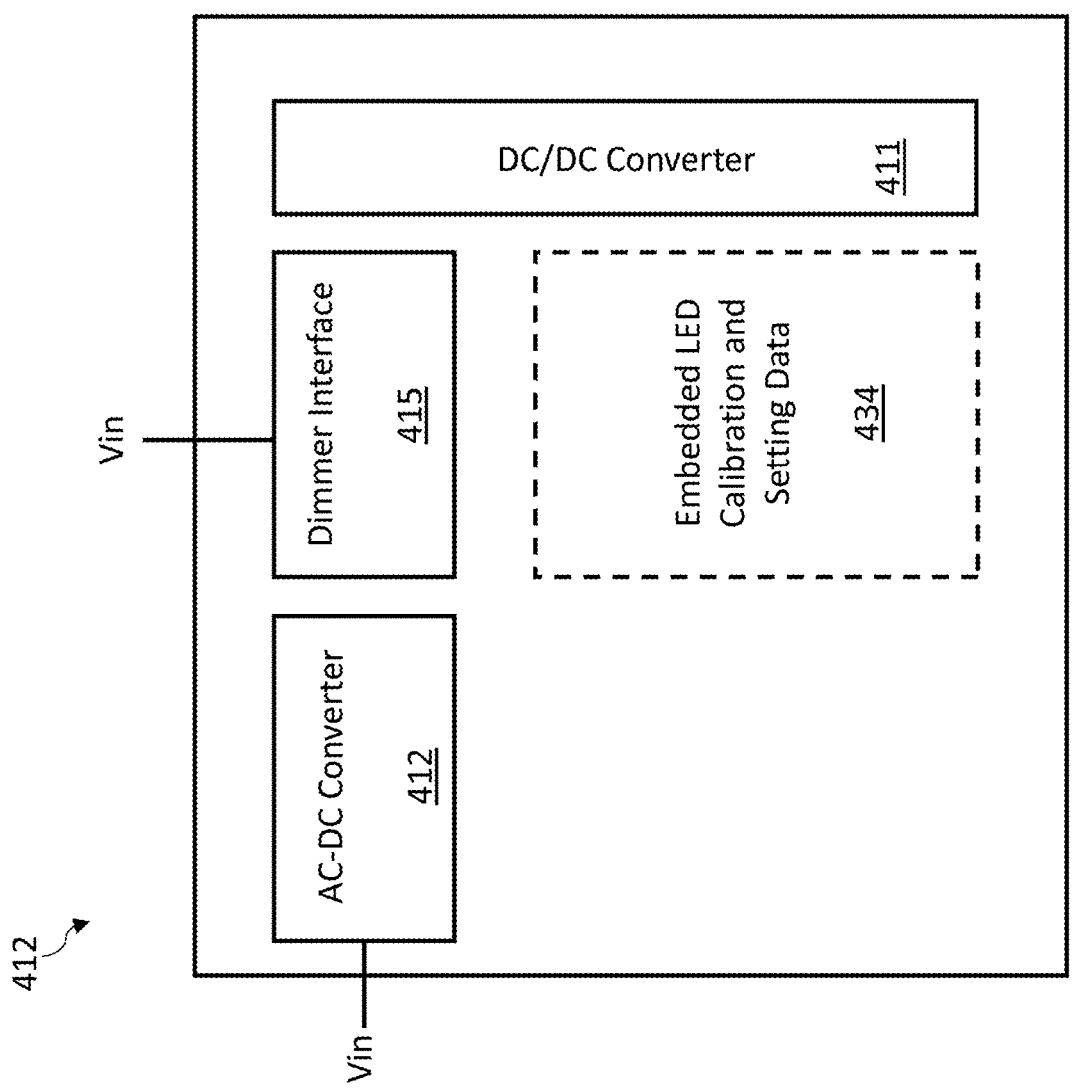
FIG. 2B is a diagram of one embodiment of a two channel integrated LED lighting system with electronic components mounted on two surfaces of a circuit board.

FIG. 2B illustrates one embodiment of a two channel integrated LED lighting system with electronic components mounted on two surfaces of a circuit board 499. As shown in FIG. 2B, an LED lighting system 400B includes a first surface 445A having inputs to receive dimmer signals and AC power signals and an AC/DC converter circuit 412 mounted on it. The LED system 400B includes a second surface 445B with the dimmer interface circuit 415, DC-DC converter circuits 440A and 440B, a connectivity and control module 416 (a wireless module in this example) having a microcontroller 472, and an LED array 410 mounted on it. The LED array 410 is driven by two independent channels 411A and 411B. In alternative embodiments, a single channel may be used to provide the drive signals to an LED array, or any number of multiple channels may be used to provide the drive signals to an LED array.

The LED array 410 may include two groups of LED devices. In an example embodiment, the LED devices of group A are electrically coupled to a first channel 411A and the LED devices of group B are electrically coupled to a second channel 411B. Each of the two DC-DC converters 440A and 440B may provide a respective drive current via single channels 411A and 411B, respectively, for driving a respective group of LEDs A and B in the LED array 410. The LEDs in one of the groups of LEDs may be configured to emit light having a different color point than the LEDs in the second group of LEDs. Control of the composite color point of light emitted by the LED array 410 may be tuned within a range by controlling the current and/or duty cycle applied by the individual DC/DC converter circuits 440A and 440B via a single channel 411A and 411B, respectively. Although the embodiment shown in FIG. 2B does not include a sensor module (as described in FIG. 2A), an alternative embodiment may include a sensor module.

The illustrated LED lighting system 400B is an integrated system in which the LED array 410 and the circuitry for operating the LED array 410 are provided on a single electronics board. Connections between modules on the same surface of the circuit board 499 may be electrically coupled for exchanging, for example, voltages, currents, and control signals between modules, by surface or sub-surface interconnections, such as traces 431, 432, 433, 434 and 435 or metallizations (not shown). Connections between modules on opposite surfaces of the circuit board 499 may be electrically coupled by through board interconnections, such as vias and metallizations (not shown).

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series or in parallel and the light having different color points may be provided. For example, warm white light may be provided by a first group of LEDs, a cool white light may be provided by a second group of LEDs, and a neutral white light may be provided by a third group.

Figure 2C:
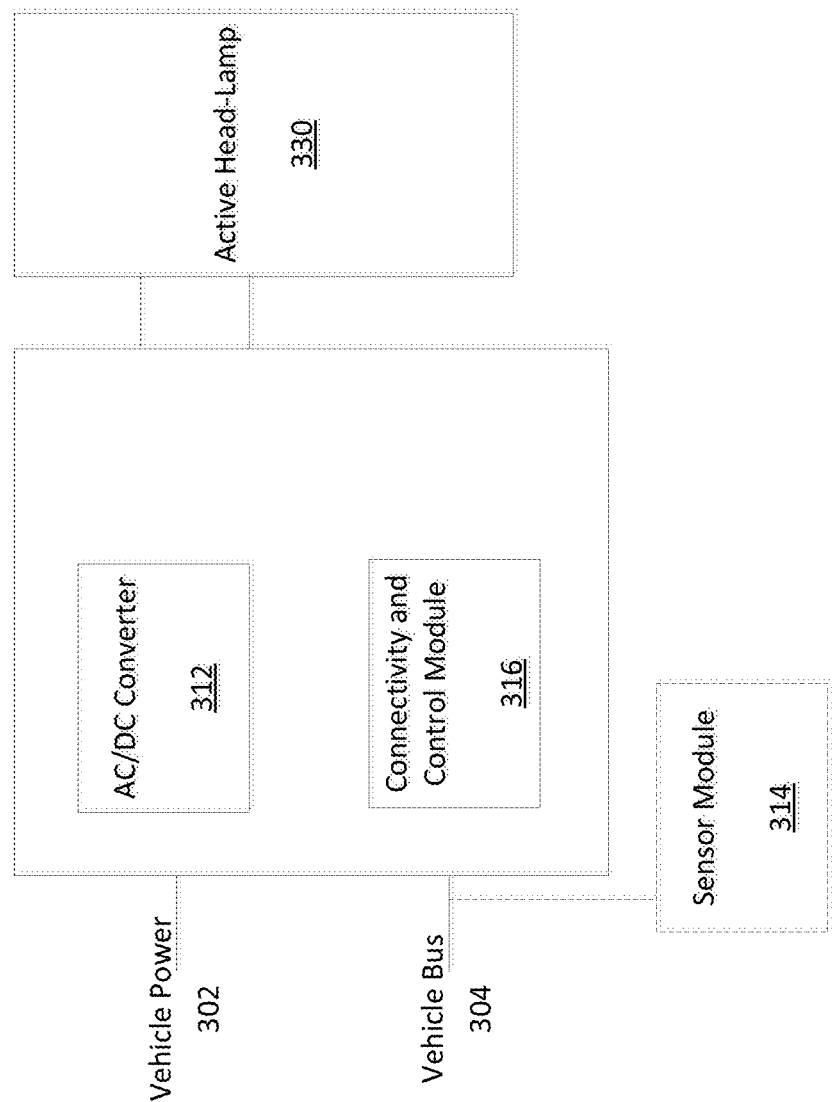
FIG. 2C is an example vehicle headlamp system.

FIG. 2C shows an example vehicle headlamp system 300 including a vehicle power 302 including a data bus 304. A sensor module 307 may be connected to the data bus 304 to provide data related to environment conditions (e.g. ambient light conditions, temperature, time, rain, fog, etc), vehicle condition (parked, in-motion, speed, direction), presence/position of other vehicles, pedestrians, objects, or the like. The sensor module 307 may be similar to or the same as the sensor module 314 of FIG. 2A. AC/DC Converter 305 may be connected to the vehicle power 302. Pixels in the active headlamp 330 may be created in accordance with the steps FIG. 1D and/or FIG. 1E and as shown in FIGS. 1F-Q.

The power module 312 (AC/DC converter) of FIG. 2C may be the same as or similar to the AC/DC converter 412 of FIG. 2B and may receive AC power from the vehicle power 302. It may convert the AC power to DC power as described in FIG. 2B for AC/DC converter 412. The vehicle head lamp system 300 may include an active head lamp 330 which receives one or more inputs provided by or based on the AC/DC converter 305, connectivity and control module 306, and/or sensor module 307. As an example, the sensor module 307 may detect the presence of a pedestrian such that the pedestrian is not well lit, which may reduce the likelihood that a driver sees the pedestrian. Based on such sensor input, the connectivity and control module 306 may output data to the active head lamp 330 using power provided from the AC/DC converter 305 such that the output data activates a subset of LEDs in an LED array contained within active head lamp 330. The subset of LEDs in the LED array, when activated, may emit light in the direction where the sensor module 307 sensed the presence of the pedestrian. These subset of LEDs may be deactivated or their light beam direction may otherwise be modified after the sensor module 207 provides updated data confirming that the pedestrian is no longer in a path of the vehicle that includes vehicle head lamp system.

Figure 3:
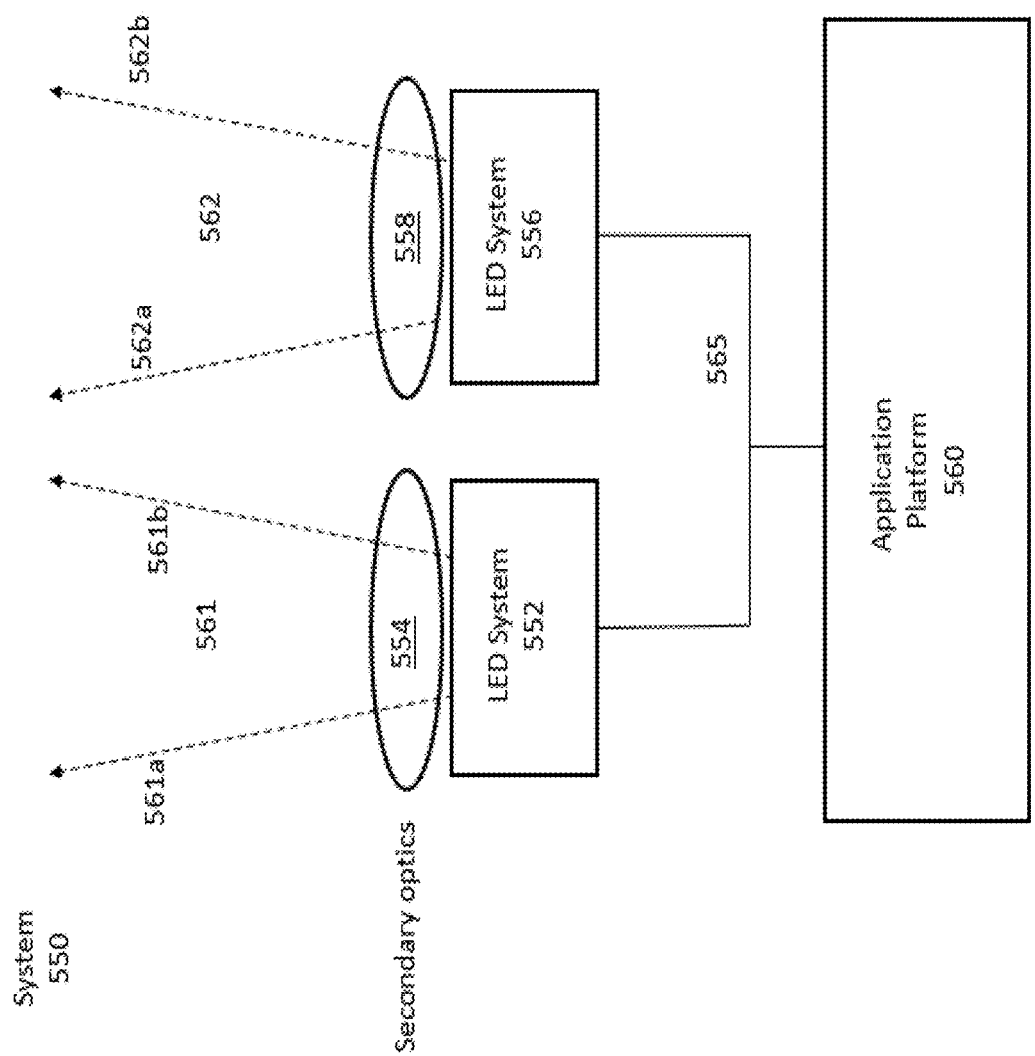
FIG. 3 shows an example illumination system.

FIG. 3 shows an example system 1350 which includes an application platform 1360, LED systems 552 and 556, and optics 554 and 558. Pixels in the arrays of LED systems 552 and 556 may be created in accordance with the steps FIG. 1D and/or FIG. 1E and as shown in FIGS. 1F-Q. The LED System 552 produces light beams 5161 shown between arrows 5161a and 5161b. The LED System 556 may produce light beams 5162 between arrows 5162a and 5162b. In the embodiment shown in FIG. 3, the light emitted from LED System 552 passes through secondary optics 554, and the light emitted from the LED System 556 passes through secondary optics 558. In alternative embodiments, the light beams 5161 and 5162 do not pass through any secondary optics. The secondary optics may be or may include one or more light guides. The one or more light guides may be edge lit or may have an interior opening that defines an interior edge of the light guide. LED systems 552 and/or 556 may be inserted in the interior openings of the one or more light guides such that they inject light into the interior edge (interior opening light guide) or exterior edge (edge lit light guide) of the one or more light guides. LEDs in LED systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 552 and 556 to be shaped in a desired manner such as, for example, with a gradient, a chamfered distribution, a narrow distribution, a wide distribution, an angular distribution, or the like.

In example embodiments, the system 1350 may be a mobile phone of a camera flash system, indoor residential or commercial lighting, outdoor light such as street lighting, an automobile, a medical device, AR/VR devices, and robotic devices. The LED System 400A shown in FIG. 2A and vehicle head lamp system 300 shown in FIG. 2C illustrate LED systems 552 and 556 in example embodiments.

The application platform 1360 may provide power to the LED systems 552 and/or 556 via a power bus via line 5165 or other applicable input, as discussed herein. Further, application platform 1360 may provide input signals via line 5165 for the operation of the LED system 552 and LED system 556, which input may be based on a user input/preference, a sensed reading, a pre-programmed or autonomously determined output, or the like. One or more sensors may be internal or external to the housing of the application platform 1360. Alternatively or in addition, as shown in the LED system 400 of FIG. 2A, each LED System 552 and 556 may include its own sensor module, connectivity and control module, power module, and/or LED devices.

In embodiments, application platform 1360 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be related a physical item or entity such as an object, an individual, a vehicle, etc. For example, sensing equipment may collect object proximity data for an ADAS/AV based application, which may prioritize the detection and subsequent action based on the detection of a physical item or entity. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

In example embodiment, application platform 1360 may represent an automobile and LED system 552 and LED system 556 may represent automobile headlights. In various embodiments, the system 1350 may represent an automobile with steerable light beams where LEDs may be selectively activated to provide steerable light. For example, an array of LEDs may be used to define or project a shape or pattern or illuminate only selected sections of a roadway. In an example embodiment, Infrared cameras or detector pixels within LED systems 552 and/or 556 may be sensors (e.g., similar to sensors module 314 of FIG. 2A and 307 of FIG. 2C) that identify portions of a scene (roadway, pedestrian crossing, etc.) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described. Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

The invention claimed is:

1. A method comprising:
providing a wavelength converting structure comprising a mesh comprising intersecting walls defining an array of elements;
each element comprising:
a wavelength converting layer having a first surface, an oppositely positioned second surface, and sidewalls connecting the first and second surfaces;
an optical material layer having a first surface, an oppositely positioned second surface, and sidewalls connecting the first and second surfaces, the first surface in direct contact with the second surface of the wavelength converting layer, the sidewalls of the optical material layer parallel to the sidewalls of the wavelength converting layer;
an optical isolation material coating the sidewalls of the wavelength converting layer and the optical material layer, the optical isolation material in direct contact with the walls of the mesh; and
a trace sacrificial material between the optical material layer and the wavelength converting layer;
providing an array of semiconductor light emitting devices (LED array) having a plurality of light emitting devices;
aligning the wavelength converting structure with the LED array so that each light emitting device of the LED array is aligned with an element of the wavelength converting structure; and
after aligning the wavelength converting structure with the LED array, attaching each of the light emitting devices to the wavelength converting layer within the aligned element to form pixels.

2. The method of claim 1, wherein providing a wavelength converting structure comprises:
providing a wafer mesh having an array of cavities separated by intersecting cavity walls;
applying the optical isolation material to the cavity walls of the wafer mesh; and
after applying the optical isolation material, depositing the wavelength converting layer and the optical material layer into the cavities.

3. The method of claim 2, wherein depositing the wavelength converting layer and the optical material layer into the cavities comprises:
depositing a sacrificial layer into the cavities;
removing a portion of the sacrificial layer to create a first gap area such that the cavities include the first gap area and a remaining sacrificial layer;
depositing an optical material into at least a portion of the first gap area to form the optical material layer;
removing a portion of the remaining sacrificial layer to form a second gap area and leave the trace sacrificial material; and
depositing the wavelength converting layer into the second gap area.

4. The method of claim 2, wherein the cavities are each less than 500 microns wide.

5. The method of claim 1, comprising after attaching the light emitting devices, cutting the walls of the mesh.

6. The method of claim 1, wherein the optical material layer comprises at least one of a scattering material or an off-state white material.

7. The method of claim 1, wherein providing the wavelength converting structure comprises depositing the optical isolation material onto the mesh in an ALD process.

8. The method of claim 1, further comprising:
after aligning the wavelength converting structure with the LED array, curing the wavelength converting structure with the LED array at a temperature in a range from 150° C. to 180° C.

9. The method of claim 1, wherein the distance between centers of pixels that are adjacent to each other is 120 microns or less.

10. The method of claim 9, wherein the distance between centers of pixels that are adjacent to each other is 45 microns or less.

11. The method of claim 1, further comprising:
after attaching the light emitting devices, removing part of the walls of the mesh to form channels between the pixels.

12. The method of claim 11, further comprising:
filling the channels between the pixels with a second optical isolation material.

13. The method of claim 11, wherein removing part of the walls of the mesh comprises employing lasers.

14. The method of claim 11, wherein removing part of the walls of the mesh comprises employing chemical treatment.

15. A method comprising:
providing a wafer mesh having an array of cavities separated by intersecting cavity walls;
applying an optical isolation material to the cavity walls of the wafer mesh;
depositing a sacrificial layer into the cavities;
after applying the optical isolation material, depositing an optical material layer into the cavities so that the optical material layer is in direct contact with the optical isolation material, the depositing the optical material layer comprising:
removing a portion of the sacrificial layer to create a first gap area such that the cavities include the first gap area and a remaining sacrificial layer; and
depositing an optical material into at least a portion of the first gap area;
after applying the optical isolation material, depositing a wavelength converting layer into the cavities so that the wavelength converting layer is in direct contact with the optical isolation material, the depositing the wavelength converting layer comprising:
removing a portion of the remaining sacrificial layer to form a second gap area; and
depositing the wavelength converting layer into the second gap area.

16. The method of claim 15, wherein the optical material layer comprises at least one of a scattering material or an off-state white material.

17. The method of claim 15, wherein the cavities are each less than 500 microns wide.

18. The method of claim 15, wherein the element of the wavelength converting layer has greater width than the light emitting device it is attached to.

19. The method of claim 15, wherein an element of the optical material layer has greater width than the light emitting device it is disposed over.

20. The method of claim 15, wherein the sacrificial layer is deposited into the cavities by one of screen-printing, contact printing, dip coating, spray coating, and lithography.

* * * * *